United States Patent
Aoki et al.

(10) Patent No.: US 11,081,351 B2
(45) Date of Patent: Aug. 3, 2021

(54) METHOD OF PROCESSING SUBSTRATE, DEVICE MANUFACTURING METHOD, AND PLASMA PROCESSING APPARATUS

(71) Applicant: Tokyo Electron Limited, Tokyo (JP)

(72) Inventors: Yusuke Aoki, Miyagi (JP); Toshikatsu Tobana, Miyagi (JP); Shinya Morikita, Miyagi (JP); Satoru Nakamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/989,810

(22) Filed: Aug. 10, 2020

(65) Prior Publication Data

US 2021/0057212 A1 Feb. 25, 2021

(30) Foreign Application Priority Data

Aug. 21, 2019 (JP) .............................. JP2019-151441

(51) Int. Cl.
*H01L 21/027* (2006.01)
*H01J 37/32* (2006.01)

(52) U.S. Cl.
CPC .... *H01L 21/0273* (2013.01); *H01J 37/32577* (2013.01); *H01J 2237/334* (2013.01)

(58) Field of Classification Search
None
See application file for complete search history.

(56) References Cited

U.S. PATENT DOCUMENTS 9,437,450 B2 * 9/2016 Kikuchi ............ H01L 21/31116

FOREIGN PATENT DOCUMENTS

| JP | 2006-270019 A | 10/2006 |
| JP | 2014-096499 A | 5/2014 |
| JP | 2017-098455 A | 6/2017 |

* cited by examiner

*Primary Examiner* — Roberts P Culbert
(74) *Attorney, Agent, or Firm* — Studebaker & Brackett PC

(57) ABSTRACT

A disclosed method of processing a substrate includes (a) providing a substrate in a chamber of a plasma processing apparatus. The substrate has a patterned organic mask. The method further includes (b) generating plasma from a processing gas in the chamber in a state where the substrate is accommodated in the chamber. The method further includes (c) periodically applying a pulsed negative direct-current voltage to an upper electrode of the plasma processing apparatus, during execution of the generating plasma (that is, the above (b)). In the applying a pulsed negative direct-current voltage, ions from the plasma are supplied to the upper electrode, so that a silicon-containing material which is released from the upper electrode is deposited on the substrate.

17 Claims, 6 Drawing Sheets

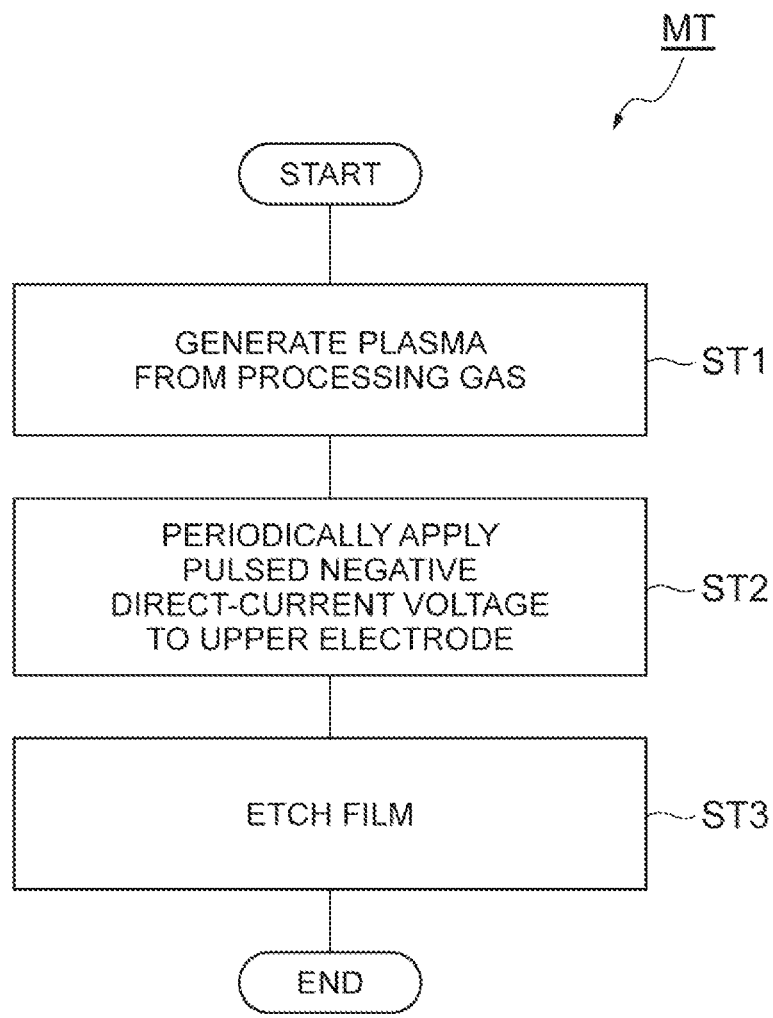

METHOD OF PROCESSING SUBSTRATE, DEVICE MANUFACTURING METHOD, AND PLASMA PROCESSING APPARATUS

CROSS-REFERENCE TO RELATED APPLICATIONS

This application is based on and claims the benefit of priority from Japanese Patent Application No. 2019-151441 filed on Aug. 21, 2019, the entire contents of which are incorporated herein by reference.

TECHNICAL FIELD

Exemplary embodiments of the present disclosure relate to a method of processing a substrate, a device manufacturing method, and a plasma processing apparatus.

BACKGROUND

In the manufacture of electronic devices, a substrate having a patterned organic mask may be processed using plasma. Japanese Patent Application Laid-Open Publication Nos. 2017-98455, 2014-96499, and 2006-270019 disclose plasma processing for modifying an organic mask. In the plasma processing disclosed in these literatures, a capacitively-coupled plasma processing apparatus is used. The capacitively-coupled plasma processing apparatus includes a chamber, a substrate support, and an upper electrode. The substrate support is provided in the chamber. The upper electrode is provided above the substrate support. Plasma is generated from a processing gas in the chamber. Then, a negative direct-current voltage is applied to the upper electrode. As a result, positive ions from the plasma collide with the upper electrode, so that secondary electrons and/or silicon are released from the upper electrode. The released secondary electrons and/or silicon modify the organic mask.

SUMMARY

In an exemplary embodiment, a method of processing a substrate is provided. The method includes (a) providing a substrate having a patterned organic mask in a chamber of a plasma processing apparatus. The method further includes (b) generating plasma from a processing gas in the chamber in a state where the substrate is accommodated in the chamber. The method further includes (c) periodically applying a pulsed negative direct-current voltage to an upper electrode of the plasma processing apparatus, during execution of the operation (b). In the operation (c), ions from the plasma are supplied to the upper electrode, so that a silicon-containing material which is released from the upper electrode is deposited on the substrate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 1 is a flowchart of a method of processing a substrate according to an exemplary embodiment.

DETAILED DESCRIPTION

Figure 2A:
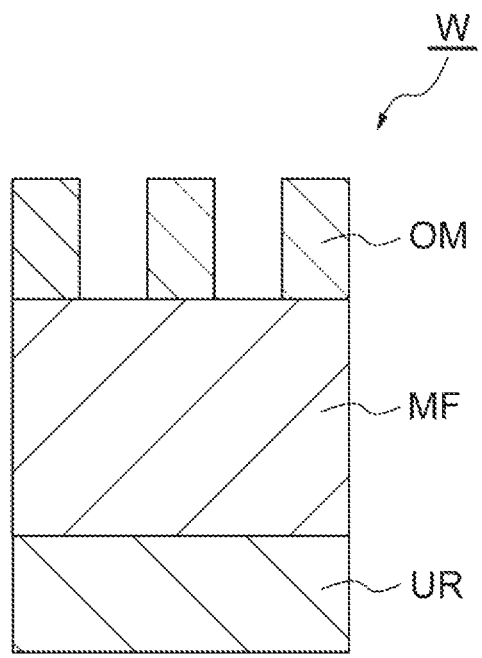
FIG. 2A and FIG. 2B are partially enlarged sectional views of a substrate of an example.

Hereinafter, various exemplary embodiments will be described.

In an exemplary embodiment, a method of processing a substrate is provided. The method includes (a) providing a substrate having a patterned organic mask in a chamber of a plasma processing apparatus. The method further includes (b) generating plasma from a processing gas in the chamber in a state where the substrate is accommodated in the chamber. The method further includes (c) periodically applying a pulsed negative direct-current voltage to an upper electrode of the plasma processing apparatus, during execution of the operation (b). In the operation (c), ions from the plasma are supplied to the upper electrode, so that a silicon-containing material which is released from the upper electrode is deposited on the substrate.

The energy of ions colliding with an upper electrode from plasma in a chamber tends to increase as the frequency of the voltage which is applied to the upper electrode decreases. In the method according to the embodiment described above, the energy of ions colliding with the upper electrode from the plasma in the chamber depends on a frequency (hereinafter referred to as a "pulse frequency") that is the reciprocal of a cycle at which the pulsed negative direct-current voltage is applied to the upper electrode. The pulse frequency may be set to a frequency lower than the frequency of the radio frequency power. Therefore, in the method according to the embodiment described above, it is possible to cause ions having high energy to collide with the upper electrode. As a result, a relatively large amount of silicon-containing material can be released from the upper electrode and supplied to the substrate. According to the method according to the embodiment described above, since a relatively large amount of silicon-containing material can be deposited on the substrate, it is possible to suppress variation in the shape of the pattern of the organic mask and a reduction of the organic mask.

In an exemplary embodiment, the processing gas may include at least one of an argon gas, a hydrogen gas, or a nitrogen gas. The processing gas may be a mixed gas of an argon gas and a hydrogen gas.

In an exemplary embodiment, a duty ratio, which is a proportion of a time during which the pulsed negative direct-current voltage is applied in one cycle, may be 0.2 or more and 0.5 or less.

In an exemplary embodiment, a frequency, which is a reciprocal of a cycle at which the pulsed negative direct-current voltage is applied to the upper electrode, may be lower than a frequency of radio frequency power for generating the plasma. For example, the frequency may be 400 kHz or more and 1 MHz or less.

In an exemplary embodiment, an absolute value of the pulsed negative direct-current voltage may be 500 V or more and 1200 V or less.

In an exemplary embodiment, the substrate may further have a film. The organic mask may be provided on the film. In this embodiment, the method may further include (d) etching the film by using plasma which is generated from another processing gas in the chamber.

In an exemplary embodiment, the operation (b) and the operation (d) may be executed in the same plasma processing apparatus or may be executed in different plasma processing apparatuses.

In an exemplary embodiment, a sequence which includes the operation (b), the operation (c), and the operation (d) may be repeated multiple times.

In another exemplary embodiment, a device manufacturing method is provided. The device manufacturing method includes processing a substrate having a patterned organic mask by the method according to any one of the embodiments described above.

In another exemplary embodiment, a plasma processing apparatus is provided. The plasma processing apparatus includes a chamber, a substrate support, a radio frequency power source, an upper electrode, a direct-current power source device, and a controller. The substrate support is provided in the chamber. The radio frequency power source is configured to generate radio frequency power to generate plasma in the chamber. The upper electrode is provided above the substrate support. The direct-current power source device is connected to the upper electrode. The controller is configured to control the radio frequency power source and the direct-current power source device. The controller is configured to execute processing which includes the following operations (a), (b), and (c). The operation (a) includes providing a substrate having a patterned organic mask in the chamber. The operation (b) includes generating plasma from a processing gas in the chamber by controlling the radio frequency power source to supply radio frequency power. The operation (c) includes periodically applying a pulsed negative direct-current voltage to the upper electrode by control for the direct-current power source device during execution of the operation (b) to supply ions from the plasma to the upper electrode to deposit a silicon-containing material which is released from the upper electrode on the substrate.

In an exemplary embodiment, the direct-current power source device may include a variable direct-current power source and a switching device.

Hereinafter, various exemplary embodiments will be described in detail with reference to the drawings. In the drawing, the same or equivalent portions are denoted by the same reference symbols.

FIG. 1 is a flowchart of a method of processing a substrate according to an exemplary embodiment. The method (hereinafter referred to as a "method MT") shown in FIG. 1 includes processing a substrate having an organic mask. FIG. 2A is a partially enlarged sectional view of a substrate of an example. A substrate W shown in FIG. 2A has an organic mask OM. In an embodiment, the substrate W may further include a film MF and an underlying region UR. The film MF is provided on the underlying region UR. The organic mask OM is provided on the film MF. The organic mask OM is formed of an organic material and is patterned. The pattern of the organic mask OM may be a pattern transferred to the film MF. The organic mask OM is, for example, a photoresist mask. The organic mask OM may be formed by, for example, a photolithography technique.

Figure 2B:
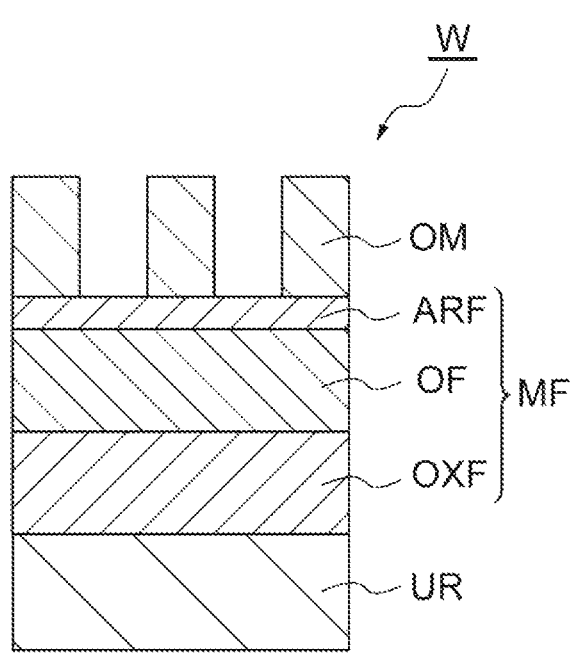

The film MF may be a single layer film. Alternatively, the film MF may be a multilayer film, as shown in FIG. 2B. In the substrate W shown in FIG. 2B, the film MF includes a film ARF, a film OF, and a film OXF. The film OXF is provided on the underlying region UR. The film OXF is, for example, a silicon oxide film. The film OF is provided on the film OXF. The film OF is, for example, an organic film. The film ARF is provided on the film OF. The film ARF is, for example, an antireflection film containing silicon.

Figure 3:
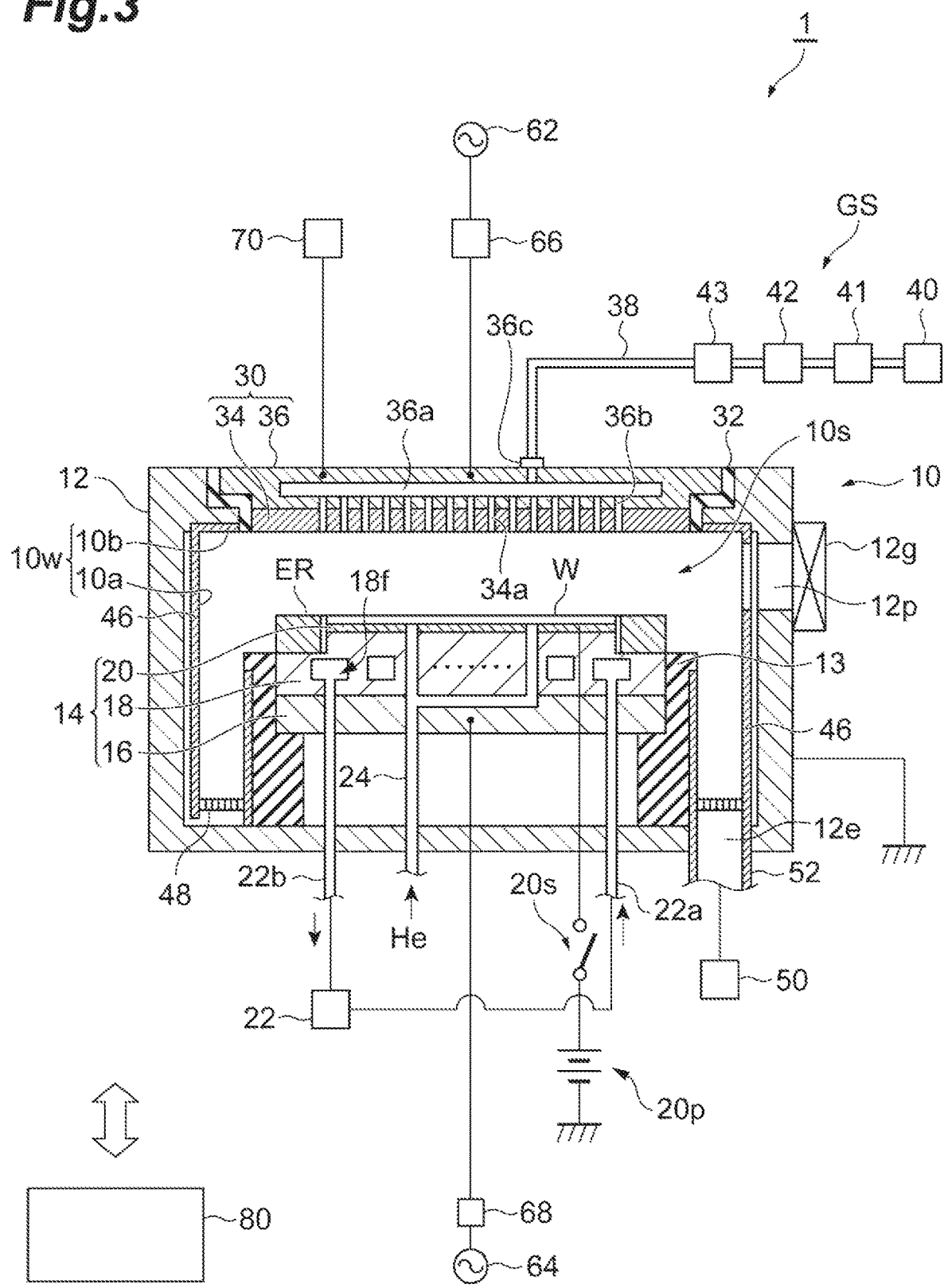
FIG. 3 is a diagram schematically showing a plasma processing apparatus according to an exemplary embodiment.

The method MT includes step ST1 and step ST2. The method MT may further include providing the substrate W in a chamber of a plasma processing apparatus before the execution of step ST1. Step ST1 and step ST2 of the method MT are executed in a state where the substrate W is accommodated in the chamber of the plasma processing apparatus. FIG. 3 is a diagram schematically showing a plasma processing apparatus according to an exemplary embodiment. A plasma processing apparatus 1 shown in FIG. 3 may be used in the execution of the method MT. The plasma processing apparatus 1 is a capacitively-coupled plasma processing apparatus.

The plasma processing apparatus 1 is provided with a chamber 10. The chamber 10 provides an internal space 10s therein. The chamber 10 includes a chamber body 12. The chamber body 12 has a substantially cylindrical shape. The internal space 10s is provided inside the chamber body 12. The chamber body 12 is formed of a conductor such as aluminum. The chamber body 12 is grounded. A film having corrosion resistance is applied to the inner wall surface of the chamber body 12. The film having corrosion resistance may be a film formed of ceramic such as aluminum oxide or yttrium oxide.

A passage 12p is formed in the side wall of the chamber body 12. A substrate W passes through the passage 12p when it is transferred between the internal space 10s and the outside of the chamber 10. The passage 12p is configured to be able to be opened and closed by a gate valve 12g. The gate valve 12g is provided along the side wall of the chamber body 12.

A support 13 is provided on a bottom portion of the chamber body 12. The support 13 is formed of an insulating material. The support 13 has a substantially cylindrical shape. The support 13 extends upward from the bottom portion of the chamber body 12 in the internal space 10s. The support 13 supports a substrate support 14. The substrate support 14 is configured to support the substrate W in the chamber 10, that is, in the internal space 10s.

The substrate support 14 includes a lower electrode 18 and an electrostatic chuck 20. The lower electrode 18 and the electrostatic chuck 20 are provided in the chamber 10. The substrate support 14 may further include an electrode plate 16. The electrode plate 16 is formed of a conductor such as aluminum, for example, and has a substantial disk shape. The lower electrode 18 is provided on the electrode plate 16. The lower electrode 18 is formed of a conductor such as aluminum, for example, and has a substantial disk shape. The lower electrode 18 is electrically connected to the electrode plate 16.

The electrostatic chuck 20 is provided on the lower electrode 18. The substrate W is placed on an upper surface of the electrostatic chuck 20. The electrostatic chuck 20 has a main body and an electrode. The main body of the electrostatic chuck 20 is formed of a dielectric. The electrode of the electrostatic chuck 20 is an electrode having a film shape and is provided in the main body of the electrostatic chuck 20. The electrode of the electrostatic chuck 20 is connected to a direct-current power source 20p through a switch 20s. When the voltage from the direct-current power source 20p is applied to the electrode of the electrostatic chuck 20, an electrostatic attraction force is generated between the electrostatic chuck 20 and the substrate W. Due to the generated electrostatic attraction force, the substrate W is attracted to the electrostatic chuck 20 and held by the electrostatic chuck 20.

An edge ring ER is disposed on the substrate support 14. The edge ring ER may be formed of silicon, silicon carbide, or quartz, but not limited thereto. When processing of the substrate W is performed in the chamber 10, the substrate W is disposed on the electrostatic chuck 20 and in a region surrounded by the edge ring ER.

A flow path 18f is provided in the interior of the lower electrode 18. A heat exchange medium (for example, a refrigerant) is supplied from a chiller unit 22 to the flow path 18f through a pipe 22a. The chiller unit 22 is provided outside the chamber 10. The heat exchange medium supplied to the flow path 18f is returned to the chiller unit 22 through a pipe 22b. In the plasma processing apparatus 1, the temperature of the substrate W placed on the electrostatic chuck 20 is adjusted by the heat exchange between the heat exchange medium and the lower electrode 18.

The plasma processing apparatus 1 may be further provided with a gas supply line 24. The gas supply line 24 supplies a heat transfer gas (for example, He gas) to a gap between the upper surface of the electrostatic chuck 20 and the back surface of the substrate W. The heat transfer gas is supplied from a heat transfer gas supply mechanism to the gas supply line 24.

The plasma processing apparatus 1 further includes an upper electrode 30. The upper electrode 30 is provided above the substrate support 14. The upper electrode 30 is supported on an upper portion of the chamber body 12 through a member 32. The member 32 is formed of a material having insulation properties. The upper electrode 30 and the member 32 close the upper opening of the chamber body 12.

The upper electrode 30 may include a ceiling plate 34 and a support 36. The lower surface of the ceiling plate 34 is a lower surface on the internal space 10s side and defines the internal space 10s. The ceiling plate 34 is formed of a silicon-containing material. The ceiling plate 34 is formed of, for example, silicon, silicon carbide, or silicon oxide. A plurality of gas discharge holes 34a are formed in the ceiling plate 34. The plurality of gas discharge holes 34a penetrate the ceiling plate 34 in a plate thickness direction thereof.

The support 36 detachably supports the ceiling plate 34. The support 36 is formed of a conductive material such as aluminum. A gas diffusion chamber 36a is provided in the interior of the support 36. A plurality of gas holes 36b are formed in the support 36. The plurality of gas holes 36b extend downward from the gas diffusion chamber 36a. The plurality of gas holes 36b respectively communicate with the plurality of gas discharge holes 34a. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 configure a gas supply unit GS. The gas source group 40 includes a plurality of gas sources. Each of the valve group 41 and the valve group 43 includes a plurality of on-off valves. The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through a corresponding on-off valve of the valve group 41, a corresponding flow rate controller of the flow rate controller group 42, and a corresponding on-off valve of the valve group 43.

In the plasma processing apparatus 1, a shield 46 is detachably provided along the inner wall surface of the chamber body 12. The shield 46 is also provided on the outer periphery of the support 13. The shield 46 prevents a byproduct of plasma processing from adhering to the chamber body 12. The shield 46 is grounded. The shield 46 is configured, for example, by forming a film having corrosion resistance on a surface of a member formed of aluminum. The film having corrosion resistance may be a film formed of ceramic such as yttrium oxide. In an embodiment, the shield 46 provides an inner wall surface 10w which the side wall of the chamber 10 has. The inner wall surface 10w includes a first region 10a and a second region 10b. The first region 10a extends on the side of the internal space 10s. The second region 10b extends above the internal space 10s and on the side of the upper electrode 30. The first region 10a and the second region 10b may be provided by another member, for example the chamber body 12, instead of the shield 46.

A baffle plate 48 is provided between the support 13 and the side wall of the chamber body 12. The baffle plate 48 is configured, for example, by forming a film having corrosion resistance on a surface of a member formed of aluminum. The film having corrosion resistance may be a film formed of ceramic such as yttrium oxide. A plurality of through-holes are formed in the baffle plate 48. An exhaust port 12e is provided below the baffle plate 48 and in the bottom portion of the chamber body 12. An exhaust device 50 is connected to the exhaust port 12e through an exhaust pipe 52. The exhaust device 50 has a pressure adjusting valve and a vacuum pump such as a turbo molecular pump.

The plasma processing apparatus 1 further includes a first radio frequency power source 62 and a second radio frequency power source 64. The first radio frequency power source 62 is a power source configured to generate first radio frequency power. In an example, the first radio frequency power has a frequency suitable for the generation of plasma. The frequency of the first radio frequency power is, for example, a frequency in a range of 27 MHz to 100 MHz. The first radio frequency power source 62 is connected to the upper electrode 30 through a matcher 66. The matcher 66 has a circuit configured to match the impedance on the load side (the upper electrode 30 side) of the first radio frequency power source 62 with the output impedance of the first radio frequency power source 62. The first radio frequency power source 62 may be connected to the lower electrode 18 through the matcher 66 and the electrode plate 16.

The second radio frequency power source 64 is a power source configured to generate second radio frequency power. The second radio frequency power has a frequency lower than the frequency of the first radio frequency power. The second radio frequency power may be used as bias radio frequency power for attracting ions to the substrate W. The frequency of the second radio frequency power is, for example, a frequency in a range of 400 kHz to 40 MHz. The second radio frequency power source 64 is connected to the lower electrode 18 through a matcher 68 and the electrode plate 16. The matcher 68 has a circuit configured to match the impedance on the load side (the lower electrode 18 side)

of the second radio frequency power source 64 with the output impedance of the second radio frequency power source 64.

Figure 4:
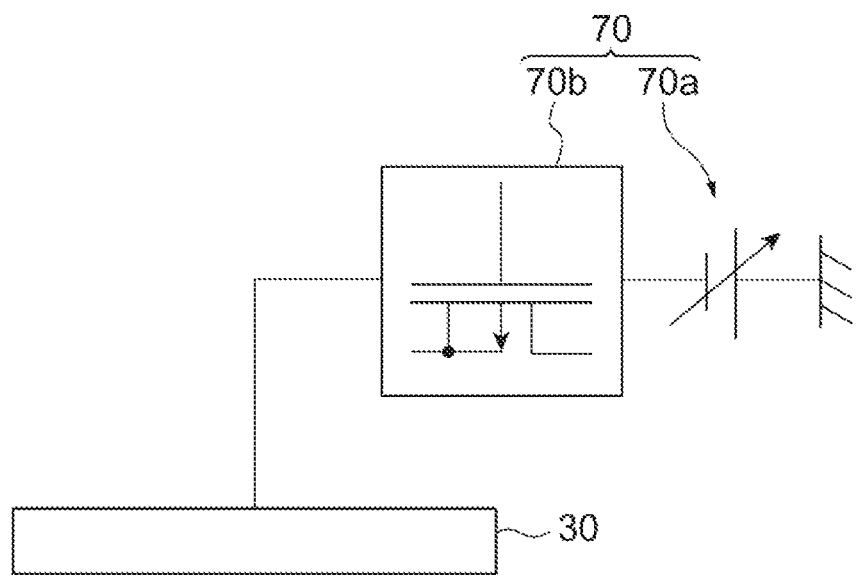
FIG. 4 is a diagram showing an example of a configuration of a direct-current power source device of the plasma processing apparatus shown in FIG. 3.
Figure 5:
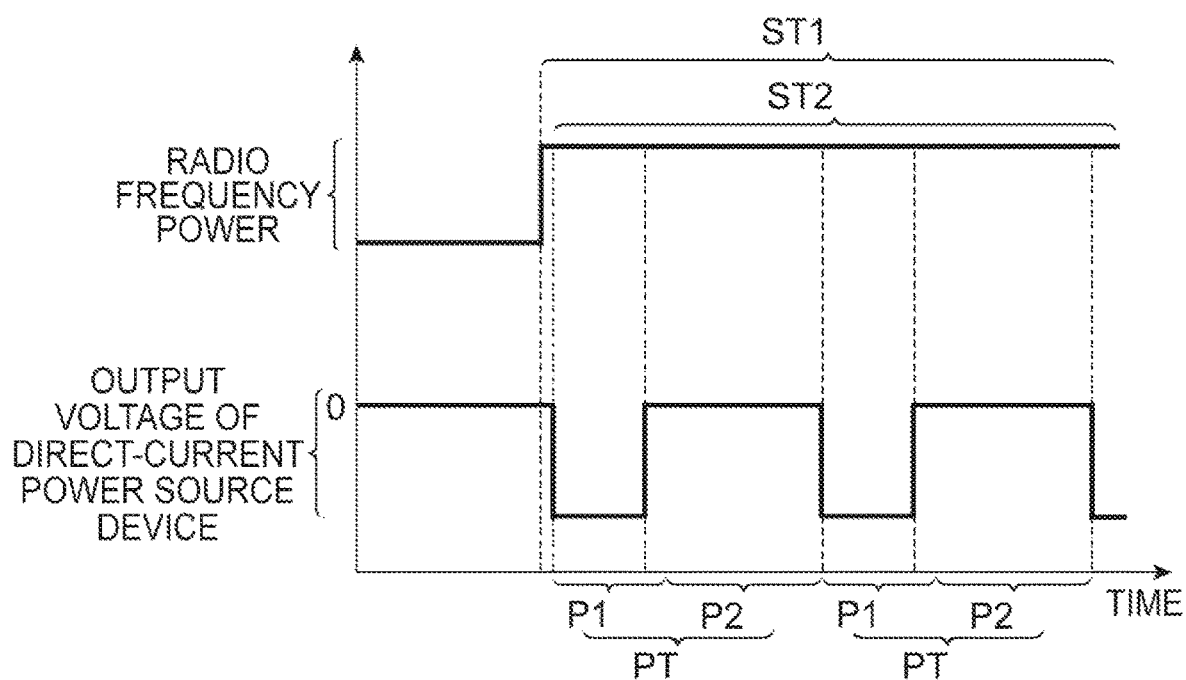
FIG. 5 is a timing chart showing an example of radio frequency power and an output voltage of the direct-current power source device in the plasma processing apparatus according to an exemplary embodiment.

The plasma processing apparatus 1 further includes a direct-current power source device 70. The direct-current power source device 70 is electrically connected to the upper electrode 30. The direct-current power source device 70 is configured to periodically generate a pulsed negative direct-current voltage. FIG. 4 is a diagram showing an example of a configuration of a direct-current power source device of the plasma processing apparatus shown in FIG. 3. FIG. 5 is a timing chart showing an example of radio frequency power and an output voltage of the direct-current power source device in the plasma processing apparatus according to an exemplary embodiment. In FIG. 5, the horizontal axis represents time. In FIG. 5, the vertical axis represents supply of radio frequency power (the first radio frequency power and/or the second radio frequency power), and the output voltage of the direct-current power source device 70. In FIG. 5, a high level of radio frequency power indicates that the radio frequency power is being supplied. In FIG. 5, a low level of radio frequency power indicates that the radio frequency power is not supplied. Hereinafter, FIGS. 4 and 5 will be referred to together with FIG. 3.

In an embodiment, the direct-current power source device 70 includes a variable direct-current power source 70a and a switching device 70b. The variable direct-current power source 70a is configured to generate a negative direct-current voltage. The level of the negative direct-current voltage which is output from the variable direct-current power source 70a may be controlled by a controller 80, which will be described later. The switching device 70b switches connection and disconnection between the variable direct-current power source 70a and the upper electrode 30 by switching of a conduction state thereof. The switching of the conduction state of the switching device 70b may be controlled by the controller 80.

In order to periodically output the pulsed negative direct-current voltage, the output voltage of the direct-current power source device 70 is a negative direct-current voltage in a first period P1 in a cycle PT. In an embodiment, the conduction state of the switching device 70b is switched such that the variable direct-current power source 70a and the upper electrode 30 are connected to each other, in the first period P1 within the cycle PT. The output voltage of the direct-current power source device 70 is zero volts in the remaining second period P2 in the cycle PT. In an embodiment, the conduction state of the switching device 70b is switched such that connection between the variable direct-current power source 70a and the upper electrode 30 is disconnected, in the second period P2 within the cycle PT.

In an embodiment, the proportion of the first period P1 in the cycle PT, that is, a duty ratio (duty ratio in decimal) is 0.2 or more and 0.5 or less. The duty ratio is the proportion of a time during which the pulsed negative direct-current voltage is applied from the direct-current power source device 70 to the upper electrode 30 within the cycle PT.

In an embodiment, a frequency f that is the reciprocal of the cycle PT may be 400 kHz or more. In an embodiment, the frequency f may be 1 MHz or less. In a case where the frequency f is 1 MHz or less, the independent controllability of the behavior of ions with respect to the generation of radicals in the chamber 10 is enhanced.

In an embodiment, the absolute value of the pulsed negative direct-current voltage which is applied from the direct-current power source device 70 to the upper electrode 30 in the first period P1 is 500 V or more and 1200 V or less.

The plasma processing apparatus 1 further includes the controller 80. The controller 80 may be a computer which includes a processor, a storage unit such as a memory, an input device, a display device, a signal input/output interface, and the like. The controller 80 controls each part of the plasma processing apparatus 1. In the controller 80, an operator can perform a command input operation and the like by using the input device in order to manage the plasma processing apparatus 1. Further, in the controller 80, the visualized operating status of the plasma processing apparatus 1 can be displayed by the display device. Further, a control program and recipe data are stored in the storage unit of the controller 80. The control program is executed by the processor of the controller 80 to perform various processing in the plasma processing apparatus 1. The processor of the controller 80 executes the control program and controls each part of the plasma processing apparatus 1 according to the recipe data, whereby the method MT is performed in the plasma processing apparatus 1.

Hereinafter, the method MT will be described with reference to FIG. 1 again, taking as an example a case where the method is executed using the plasma processing apparatus 1. Further, the control of each part of the plasma processing apparatus 1 by the controller 80 will also be described. In the following description, FIGS. 6A, 6B, 6C, and 6D will be referred to. FIG. 6A, FIG. 6B, FIG. 6C, and FIG. 6D are partially enlarged sectional views of a substrate of an example after each processing in the method shown in FIG. 1.

In the method MT, first, step ST1 is executed. Step ST1 is executed in a state where the substrate W is accommodated in the chamber 10. The substrate W is placed on the substrate support 14 in the chamber 10 and held by the electrostatic chuck 20. In step ST1, plasma of a processing gas is generated in the chamber 10. The processing gas is supplied from the gas supply unit GS. In an embodiment, the processing gas includes at least one of an argon gas, a hydrogen gas ($H_2$ gas), and a nitrogen gas ($N_2$ gas). In an example, the processing gas is a mixed gas of an argon gas and a hydrogen gas. In step ST1, the first radio frequency power and/or the second radio frequency power is supplied to generate plasma from the processing gas in the chamber 10.

For the execution of step ST1, the controller 80 controls the gas supply unit GS to supply the processing gas into the chamber 10. For the execution of step ST1, the controller 80 controls the exhaust device 50 to set the pressure in the chamber 10 to a specified pressure. For the execution of step ST1, the controller 80 controls the first radio frequency power source 62 and/or the second radio frequency power source 64 to supply the first radio frequency power and/or the second radio frequency power.

Step ST2 is executed during the execution of step ST1. That is, step ST2 is executed when plasma is being generated from the processing gas in the chamber 10 in step ST1. Step ST2 is executed to supply ions from the plasma in the chamber 10 to the upper electrode 30 to deposit a silicon-containing material which is released from the upper electrode 30 on the substrate W. In step ST2, a pulsed negative direct-current voltage is periodically applied from the direct-current power source device 70 to the upper electrode 30. For the execution of step ST2, the controller 80 controls the direct-current power source device 70 to periodically apply a pulsed negative direct-current voltage to the upper electrode 30.

In an embodiment, the proportion of the time during which the pulsed negative direct-current voltage is applied from the direct-current power source device 70 to the upper electrode 30 in the cycle PT, that is, the duty ratio, is 0.2 or more and 0.5 or less.

In an embodiment, the frequency f that is the reciprocal of the cycle PT may be 400 kHz or more. In an embodiment, the frequency f may be 1 MHz or less. In a case where the frequency f is 1 MHz or less, the independent controllability of the behavior of ions with respect to the generation of radicals in the chamber 10 is enhanced.

In an embodiment, the absolute value of the pulsed negative direct-current voltage which is applied from the direct-current power source device 70 to the upper electrode 30 in the first period P1 is 500 V or more and 1200 V or less.

Figure 6A:
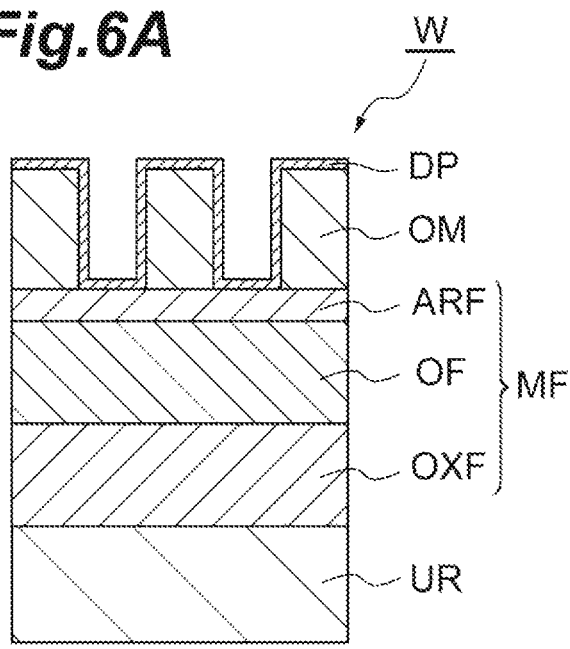
FIG. 6A, FIG. 6B, FIG. 6C, and FIG. 6D are partially enlarged sectional views of a substrate of an example after each processing in the method shown in FIG. 1.

In step ST2, positive ions are attracted to the upper electrode 30 from the plasma in the chamber 10 and collide with the ceiling plate 34 of the upper electrode 30. As a result, secondary electrons and a silicon-containing material are released from the ceiling plate 34 of the upper electrode 30. The released secondary electrons and silicon-containing material are supplied to the substrate W. The organic mask OM of the substrate W can be modified by the secondary electrons. Further, the released silicon-containing material is deposited on the organic mask OM of the substrate W to form the film DP, as shown in FIG. 6A.

The energy of the ions colliding with the upper electrode 30 from the plasma in the chamber 10 tends to increase as the frequency of the voltage which is applied to the upper electrode 30 decreases. In the method MT, the energy of the ions colliding with the upper electrode 30 from the plasma in the chamber 10 depends on the frequency f that is the reciprocal of the cycle PT in which the pulsed negative direct-current voltage is applied to the upper electrode 30. The frequency f may be set to a frequency lower than the frequency of the radio frequency power. Therefore, in the method MT, it is possible to cause ions having high energy to collide with the upper electrode 30. As a result, a relatively large amount of silicon-containing material can be released from the upper electrode 30 and supplied to the substrate W. According to the method MT, since a relatively large amount of silicon-containing material can be deposited on the substrate W, it is possible to suppress variation in the shape of the pattern of the organic mask OM and a reduction of the organic mask OM. The variation in the shape of the pattern of the organic mask OM can be evaluated by, for example, LWR (Line Width Roughness).

In an embodiment, the method MT may further include step ST3. In step ST3, the film MF is etched. The film MF may be etched using the plasma processing apparatus 1. Alternatively, the film MF may be etched using another plasma processing apparatus. Hereinafter, step ST3 will be described by taking as an example a case where the film MF shown in FIG. 2B is etched using the plasma processing apparatus 1.

Figure 6C:
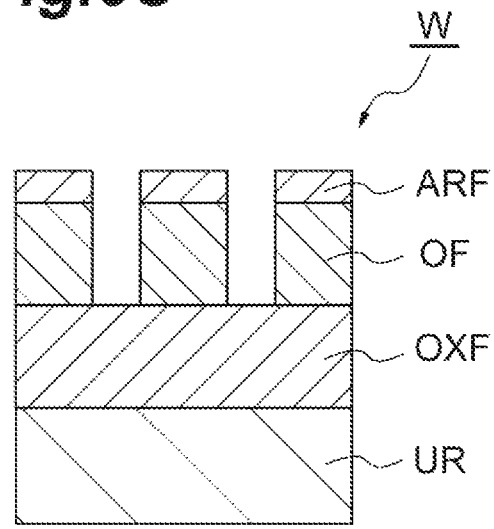
Figure 6B:
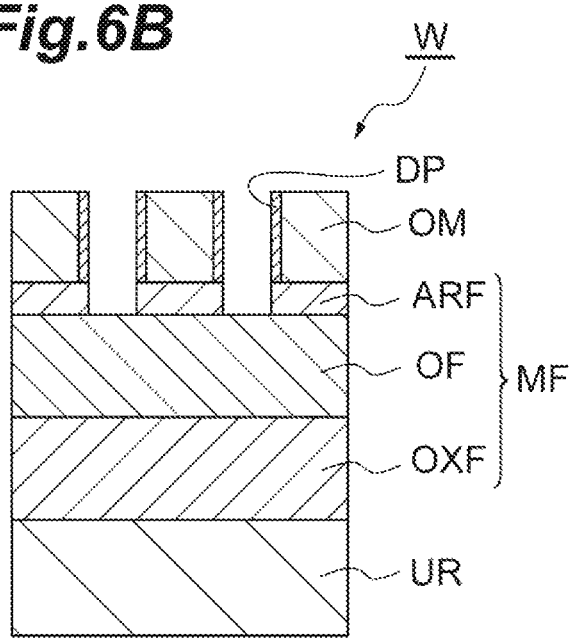

First, plasma of another processing gas is generated in the chamber 10 for plasma etching of the film ARF. In a case where the film ARF is an antireflection film containing silicon, the processing gas for the plasma etching of the film ARF may include a fluorine-containing gas such as a fluorocarbon gas. For the plasma etching of the film ARF, the controller 80 controls the gas supply unit GS to supply the processing gas into the chamber 10. For the plasma etching of the film ARF, the controller 80 controls the exhaust device 50 to set the pressure in the chamber 10 to a specified pressure. For the plasma etching of the film ARF, the controller 80 controls the first radio frequency power source 62 and/or the second radio frequency power source 64 to supply the first radio frequency power and/or the second radio frequency power. As a result of the plasma etching of the film ARF, as shown in FIG. 6B, the pattern of the organic mask OM whose width is adjusted by the film DP is transferred to the film ARF.

Subsequently, plasma of still another processing gas is generated in the chamber 10 for plasma etching of the film OF. In a case where the film OF is an organic film, the processing gas for the plasma etching of the film OF may include hydrogen gas and nitrogen gas. Alternatively, the processing gas for the plasma etching of the film OF may include an oxygen-containing gas. For the plasma etching of the film OF, the controller 80 controls the gas supply unit GS to supply the processing gas into the chamber 10. For the plasma etching of the film OF, the controller 80 controls the exhaust device 50 to set the pressure in the chamber 10 to a specified pressure. For the plasma etching of the film OF, the controller 80 controls the first radio frequency power source 62 and/or the second radio frequency power source 64 to supply the first radio frequency power and/or the second radio frequency power. As a result of the plasma etching of the film OF, as shown in FIG. 6C, the pattern of the film ARF is transferred to the film OF.

Figure 6D:
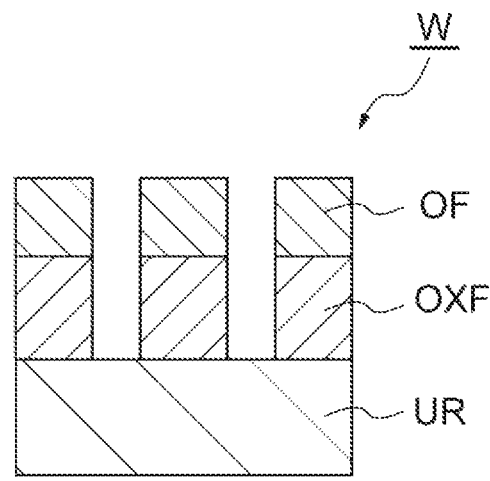

Subsequently, plasma of still yet another processing gas is generated in the chamber 10 for plasma etching of the film OXF. In a case where the film OXF is a silicon oxide film, the processing gas for the plasma etching of the film OXF may include a fluorocarbon gas. For the plasma etching of the film OXF, the controller 80 controls the gas supply unit GS to supply the processing gas into the chamber 10. For the plasma etching of the film OXF, the controller 80 controls the exhaust device 50 to set the pressure in the chamber 10 to a specified pressure. For the plasma etching of the film OXF, the controller 80 controls the first radio frequency power source 62 and/or the second radio frequency power source 64 to supply the first radio frequency power and/or the second radio frequency power. As a result of the plasma etching of the film OXF, as shown in FIG. 6D, the pattern of the film OF is transferred to the film OXF.

While various exemplary embodiments have been described above, various additions, omissions, substitutions and changes may be made without being limited to the exemplary embodiments described above. Elements of the different embodiments may be combined to form another embodiment.

For example, in the method MT, a sequence which includes step ST1, step ST2, and step ST3 may be repeated multiple times.

Hereinafter, a first experiment and a second experiment performed for evaluation of the method MT will be described. In the first experiment and the second experiment, a sample substrate having the same structure as the substrate W shown in FIG. 2B was prepared. In the sample substrate, the organic mask OM was a photoresist mask. In the sample substrate, the film ARF was an antireflection film containing silicon. In the sample substrate, the film OF was an organic film. In the sample substrate, the film OXF was a silicon oxide film. The organic mask OM of the sample substrate had a line-and-space pattern. In the organic mask OM of the sample substrate, the average value of the line width was 41.8 nm, and the LWR of the line was 3.3 nm. In the first experiment, step ST1 and step ST2 of the method MT were applied to the sample substrate by using the plasma processing apparatus 1. In step ST2 of the first experiment, the absolute value of the pulsed negative direct-current voltage applied to the upper electrode 30 was −900 V, the frequency f of the pulsed negative direct-current voltage was 400 kHz, and the duty ratio of the pulsed negative direct-current voltage was 0.5. The conditions of step ST1 and step ST2 in the first experiment are shown below.

<Conditions of Step ST1 and Step ST2 in First Experiment>

Processing time: 10 sec
Pressure in chamber 10: 100 mTorr (13.33 Pa)
First radio frequency power: 60 MHz, 300 W
Second radio frequency power: 0 W
Processing gas: 10 sccm of $H_2$ gas and 800 sccm of Ar gas In the second experiment, plasma of the processing gas was generated using the plasma processing apparatus 1 under the same conditions as in the first experiment, and a direct-current voltage of −900 V was continuously applied to the upper electrode 30 to process the sample substrate.

In each of the first experiment and the second experiment, the average value of the line width and the LWR of the organic mask OM, the shape of which was adjusted by the silicon-containing material deposited thereon, were obtained. In the first experiment, the average value of the line width was 41.8 nm and the LWR was 2.8 nm. In the second experiment, the average value of the line width was 40.6 nm and the LWR was 2.7 nm. In both the first experiment and the second experiment, the LWR after the processing was smaller than the LWR of the sample substrate before the processing. Further, in the second experiment, the average value of the line width after the processing was reduced from the average value of the line width before the processing. However, in the first experiment, the average value of the line width after the processing was the same as the average value of the line width before the processing. Therefore, it was confirmed that according to the method MT, it became possible to suppress the variation in the shape of the pattern of the organic mask and the reduction of the organic mask.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of processing a substrate comprising:
   (a) providing a substrate having a patterned organic mask in a chamber of a plasma processing apparatus;
   (b) generating plasma from a processing gas in the chamber in a state where the substrate is accommodated in the chamber; and
   (c) periodically applying a pulsed negative direct-current voltage to an upper electrode of the plasma processing apparatus during execution of said (b) to supply ions from the plasma to the upper electrode to deposit a silicon-containing material which is released from the upper electrode on the substrate.

2. The method according to claim 1, wherein the processing gas includes at least one of an argon gas, a hydrogen gas, or a nitrogen gas.

3. The method according to claim 1, wherein the processing gas is a mixed gas of an argon gas and a hydrogen gas.

4. The method according to claim 1, wherein a duty ratio, which is a proportion of a time during which the pulsed negative direct-current voltage is applied in one cycle, is 0.2 or more and 0.5 or less.

5. The method according to claim 1, wherein a frequency, which is a reciprocal of a cycle at which the pulsed negative direct-current voltage is applied to the upper electrode, is lower than a frequency of radio frequency power for generating the plasma.

6. The method according to claim 1, wherein a frequency, which is a reciprocal of a cycle at which the pulsed negative direct-current voltage is applied to the upper electrode, is 400 kHz or more and 1 MHz or less.

7. The method according to claim 1, wherein an absolute value of the pulsed negative direct-current voltage is 500 V or more and 1200 V or less.

8. The method according to claim 1, wherein the substrate further has a film, the organic mask is provided on the film, and the method further comprises:
   (d) etching the film by using plasma which is generated from another processing gas in the chamber.

9. The method according to claim 8, wherein said (b) and said (d) are executed in the same plasma processing apparatus.

10. The method according to claim 8, wherein said (b) and said (d) are executed in different plasma processing apparatuses.

11. The method according to claim 8, wherein a sequence which includes said (b), said (c), and said (d) is repeated multiple times.

12. A device manufacturing method comprising:
    processing a substrate having a patterned organic mask by the method of processing a substrate according to claim 1.

13. The method according to claim 1, wherein the upper electrode includes a ceiling plate formed of a silicon-containing material and a support detachably supporting the ceiling plate.

14. The method according to claim 13, wherein the silicon-containing material is silicon, silicon carbide, or silicon oxide.

15. The method according to claim 1, wherein the processing gas a mixed gas of an argon gas and a hydrogen gas.

16. The method according to claim 8, wherein the film includes a silicon oxide film, an organic film provided on the silicon oxide film, and an antireflection film containing silicon and provided on the organic film.

17. The method according to claim 16, wherein said (d) comprises:
    etching the antireflection film by using plasma generated from a processing gas including a fluorine-containing gas;
    etching the organic film by using plasma generated from a processing gas including a hydrogen gas and a nitrogen gas or a processing gas including an oxygen-containing gas; and
    etching the silicon oxide film by using plasma generated from a fluorocarbon gas.

* * * * *